(12) United States Patent
Sugai

(10) Patent No.: US 6,184,131 B1
(45) Date of Patent: Feb. 6, 2001

(54) PROCESS OF FORMING SOLID THIN FILM FROM LAYER OF LIQUID MATERIAL WITHOUT VOID AND FILM FORMING APPARATUS USED THEREIN

(75) Inventor: Kazumi Sugai, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/265,692

(22) Filed: Mar. 10, 1999

Related U.S. Application Data (62) Division of application No. 08/951,486, filed on Oct. 16, 1997, now Pat. No. 5,993,546.

(30) Foreign Application Priority Data

Oct. 18, 1996 (JP) .................................................. 8-276266

(51) Int. Cl.[7] .................................................. H01L 21/44
(52) U.S. Cl. .......................... 438/660; 438/631; 438/672; 427/294; 427/123; 427/398.1; 427/383.1
(58) Field of Search .................................. 438/679, 660, 438/631, 675, 678, 672; 427/419.8, 398.1, 383.1, 372.2, 374.1, 374.2, 123, 294, 376.6

(56) References Cited

U.S. PATENT DOCUMENTS

| | | | |
|---|---|---|---|
| 5,213,999 | * | 5/1993 | Sparks et al. . |
| 5,679,610 | * | 10/1997 | Matsuda et al. . |
| 5,728,626 | * | 3/1998 | Allman et al. ........................ 438/608 |
| 5,953,629 | * | 9/1999 | Imazeki et al. ....................... 438/679 |
| 5,955,140 | * | 9/1999 | Smith et al. ............................ 427/96 |

FOREIGN PATENT DOCUMENTS

| | | |
|---|---|---|
| 62-096325 | * 5/1987 | (JP) . |
| 1-286435 | 11/1989 | (JP) . |
| 2-297952 | 12/1990 | (JP) . |
| 6-310605 | 4/1994 | (JP) . |
| 8-213390 | 8/1996 | (JP) . |
| 9-45773 | 2/1997 | (JP) . |

OTHER PUBLICATIONS

English Translation of Examiner's comments regarding Japanese Office Action dated Oct. 6, 1998. citing Japanese reference above.

Y. Shacham–Diamand et al.; ULSI Application of Spin–on Titanium–Nitride Waseda University The International Conference Center; Oct. 29–30, 1991; part 2–Japan Conference; pp. 43–45.

* cited by examiner

*Primary Examiner*—Caridad Everhart
(74) *Attorney, Agent, or Firm*—McGuireWoods LLP (57) ABSTRACT

A solid thin film is formed from a layer of liquid material in such a manner as to fill a contact hole formed in a semiconductor structure; a semiconductor structure is firstly cooled rather than ambience, thereafter, liquid material is spread over the semiconductor structure, then the layer of liquid material is pressed so that the liquid material perfectly fills the contact hole, and, finally, the layer of liquid material is heated so as to form a solid layer from the layer of liquid material.

11 Claims, 7 Drawing Sheets

Fig. 7D

PROCESS OF FORMING SOLID THIN FILM FROM LAYER OF LIQUID MATERIAL WITHOUT VOID AND FILM FORMING APPARATUS USED THEREIN

CROSS REFERENCE TO RELATED APPLICATION

This application is a divisional of application Ser. No. 08/951,486, filed Oct. 16, 1997, now U.S. Pat. No. 5,993,546.

FIELD OF THE INVENTION

This invention relates to a thin film forming technology used in fabrication of a semiconductor device and, more particularly, to a process of forming a solid thin film from a layer of liquid material and a film forming apparatus used therein.

DESCRIPTION OF THE RELATED ART

A circuit component of a semiconductor integrated circuit device had been miniaturized, and the cross section of each component layer before the miniaturization was similar to the cross section of a corresponding layer after the miniaturization. If a manufacture reduces the width and the height of a conductive layer at a certain ratio, the current density is drastically increased, and the large current density damages the conductive layer. In order to improve the durability of the conductive layer, the manufacture reduces the width at a large reduction ratio and the height at a small reduction ratio, and such anisotropic reduction increases the circuit components without sacrifice of the durability. However, the anisotropic reduction enlarges the aspect ratio of a contact hole formed in the conductive layer, and the contact hole is imperfectly plugged with conductive material. Various planarization technologies have been proposed for improving step coverage.

Figure 1A:
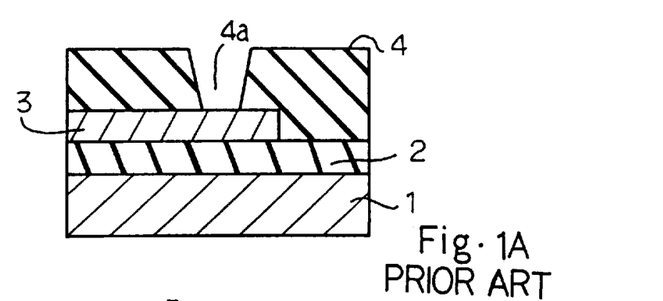
FIGS. 1A to 1D are cross sectional views showing the prior art process disclosed in the Japanese Patent Publication of Unexamined Application.

One of the prior art planarization technologies is disclosed in Japanese Patent Publication of Unexamined Application No. 4-99030, and the prior art process is illustrated in FIGS. 1A to 1D. A silicon substrate 1 is overlain by an insulating layer 2, and a first-level aluminum wiring 3 is patterned on the insulating layer 2. The first-level aluminum wiring 3 and the exposed area of the insulating layer 2 are covered with an inter-level insulating layer 4, and a contact hole 4a is formed in the inter-level insulating layer 4 in such a manner as to expose the first-level aluminum wiring 3 thereto as shown in FIG. 1A.

Figure 1B:
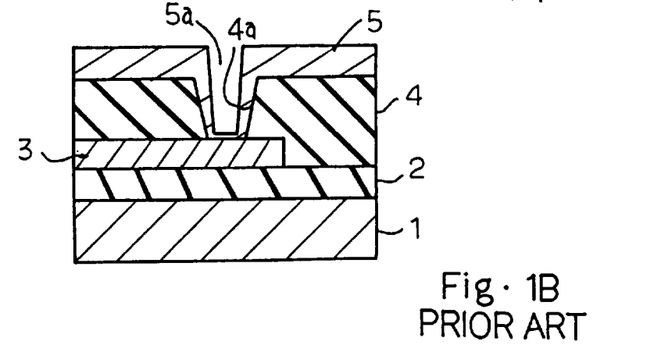

Subsequently, metal is deposited over the entire surface of the resultant semiconductor structure shown in FIG. 1A, and forms a metal layer 5. The metal can not achieve good step coverage, and a recess 5a takes place in the metal layer 5 as shown in FIG. 1B.

Figure 1C:
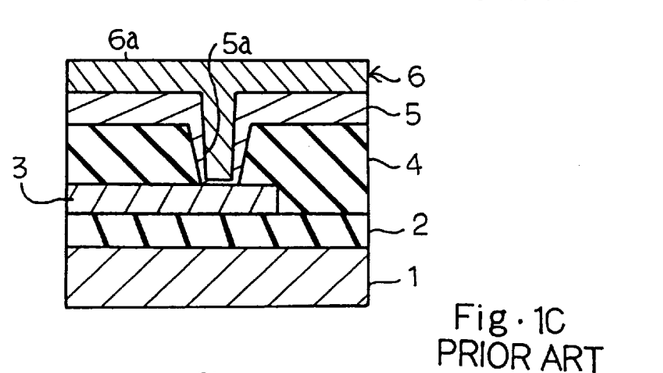

Subsequently, metal-containing liquid is prepared. Powder of chromium and tin is mixed into volatile solvent in methyl system or isopropyl system. The metal-containing liquid is dropped onto the metal layer 5 in the atmospheric ambience, and the metal-containing liquid is spread over the metal layer 5. The volatile solvent is removed at 300 degrees to 400 degrees in centigrade, and the metal powder forms a low fusing point metal layer 6. The low fusing point metal layer 6 buries the recess 5a, and creates a smooth top surface 6a as shown in FIG. 1C.

Figure 1D:
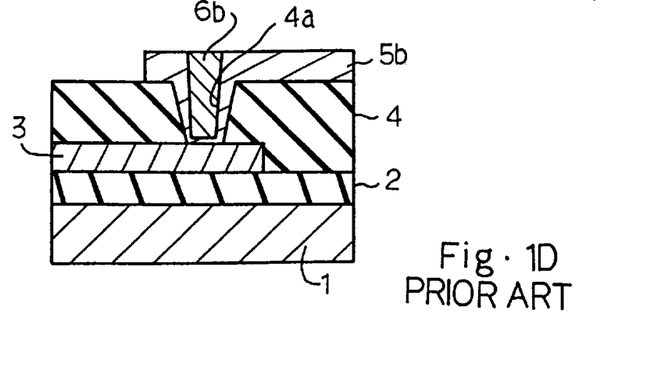

The low fusing point metal layer 6 is uniformly etched away without an etching mask, and the metal layer 5 is exposed, again. A piece 6b of low fusing point metal is left in the recess 5a, and the metal layer 5 is patterned into a second-level metal wiring 5b as shown in FIG. 1D.

Figure 2A:
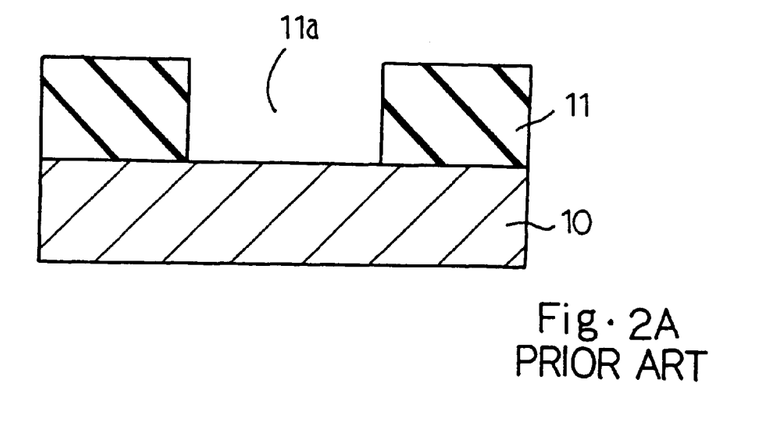
FIGS. 2A to 2C are cross sectional views showing the prior art process disclosed in the Advanced Metallization for ULSI Applications.

Another prior art planarization technology is disclosed by Y. Shacham-Diamand et al in "ULSI Application of Spin-On Titanium-Nitride", Advanced Metallization for ULSI Applications, Oct. 28–30, 1991, pages 43 to 45, and FIGS. 2A to 2C illustrate the prior art smoothening technology disclosed therein.

Firstly, a silicon substrate 10 is prepared, and the major surface of the silicon substrate 10 is covered with an insulating layer 11. The insulating layer 11 is partially removed, and a hole 11a is formed in the insulating layer 11. The silicon substrate 10 is exposed to the hole 11a as shown in FIG. 2A.

Figure 2B:
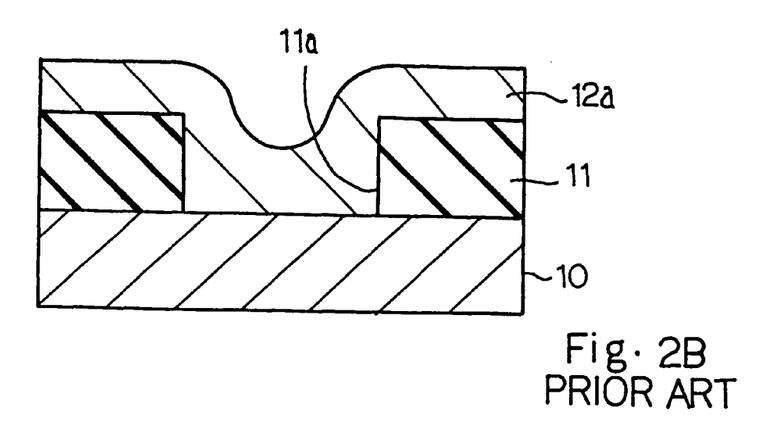
Figure 2C:
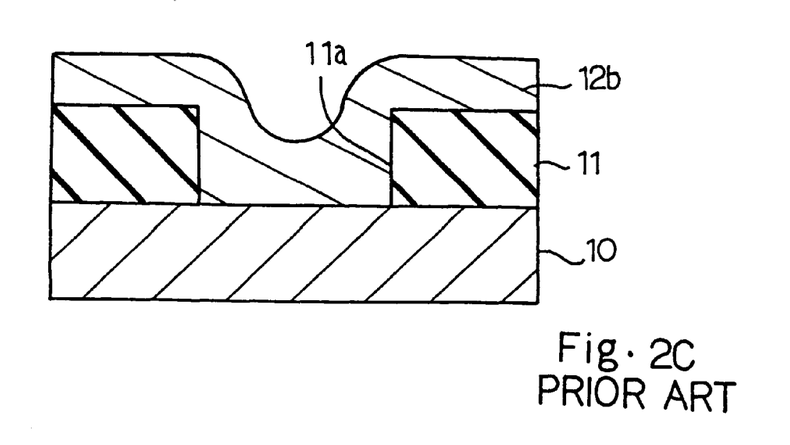

Subsequently, colloidal liquid 12a is dropped onto the resultant structure in the atmospheric ambience, and is spread over the entire surface as shown in FIG. 2B. The colloidal liquid 12a is treated with heat at 450 degrees in centigrade in vacuum, hydrogen ambience or $NH_3$. Then, a titanium nitride layer 12b is produced from the colloidal liquid.

A problem is encountered in the prior art processes in that a void takes place in the hole 5a/11a.

Another problem is high resistivity of the order of hundreds micro-ohm cm which is two figures larger than the resistivity of aluminum.

SUMMARY OF THE INVENTION

It is therefore an important object of the present invention to provide a process of forming a thin film without a void left in a recess.

It is also an important object of the present invention to provide a firm forming apparatus used in the process for forming a thin film without a void in a recess.

To accomplish the object, the present invention proposes to force a layer of liquid material into a recess or hole.

In accordance with one aspect of the present invention, there is provided a process of forming a solid thin film, comprising the steps of: preparing a substrate structure having at least one recess open to a surface of the substrate structure; changing the temperature of the substrate structure to be lower than an ambient temperature; creating vacuum around the substrate structure; supplying liquid material onto the surface of the substrate structure so as to form a layer of liquid material on the surface; pressing the layer of liquid material so as to perfectly fill the recess with the liquid material; and heating the liquid material so as to form a solid layer from the liquid layer.

In accordance with another aspect of the present invention, there is provided a firm forming apparatus comprising a vessel defining a chamber, a holder provided in the chamber for supporting a substrate structure having a recess open to a surface of the substrate structure, a temperature controller for controlling a temperature of the substrate structure to be lower than a temperature in the chamber, a liquid material feeder supplying liquid material onto the surface for covering the surface with a layer of liquid material, a pressurizer exerting force on the layer of liquid material, and a heater heating the layer of liquid material for forming a solid layer from the layer of liquid material.

BRIEF DESCRIPTION OF THE DRAWINGS

The features and advantages of the process and the system will be more clearly understood from the following description taken in conjunction with the accompanying drawings in which.

DESCRIPTION OF THE PREFERRED EMBODIMENTS

First Embodiment

Figure 3:
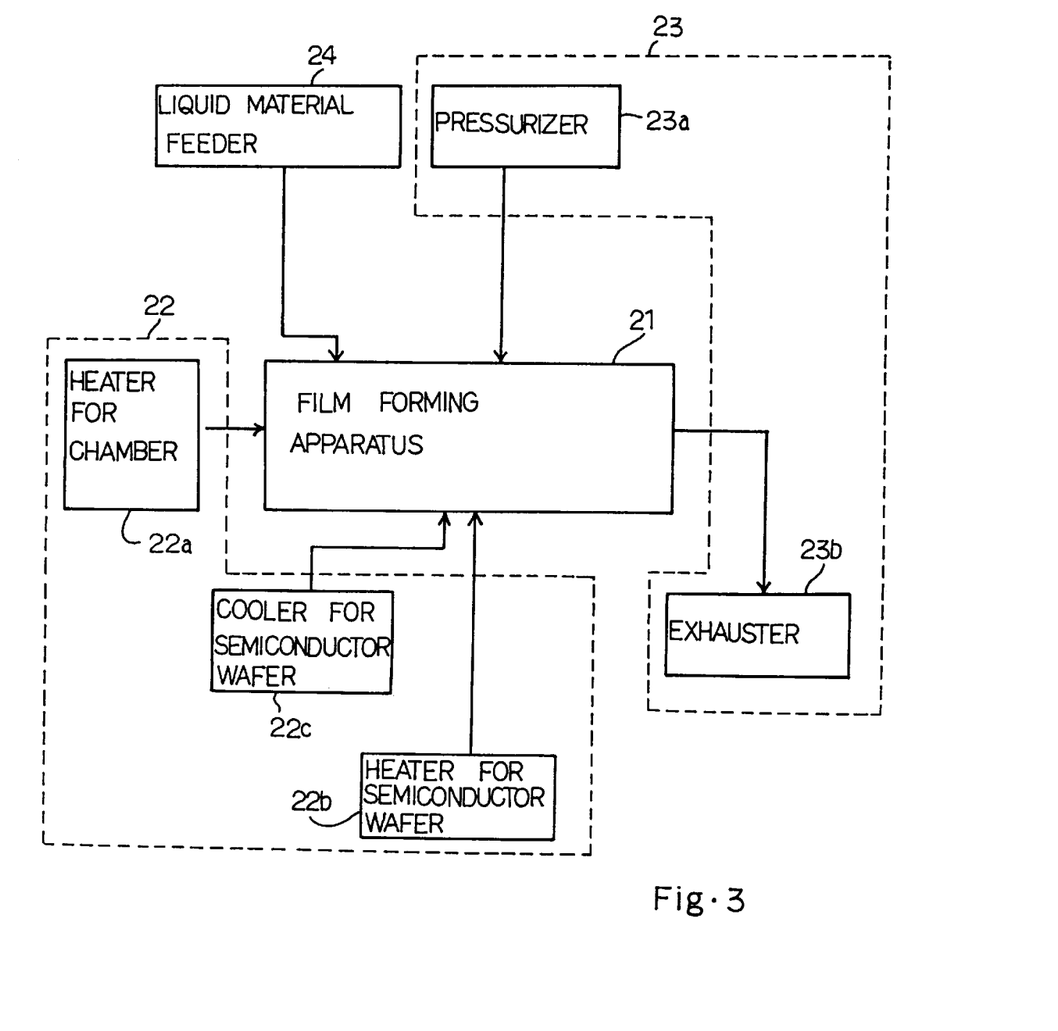
FIG. 3 is a view showing the arrangement of a system for forming a thin film according to the present invention.
Figure 4:
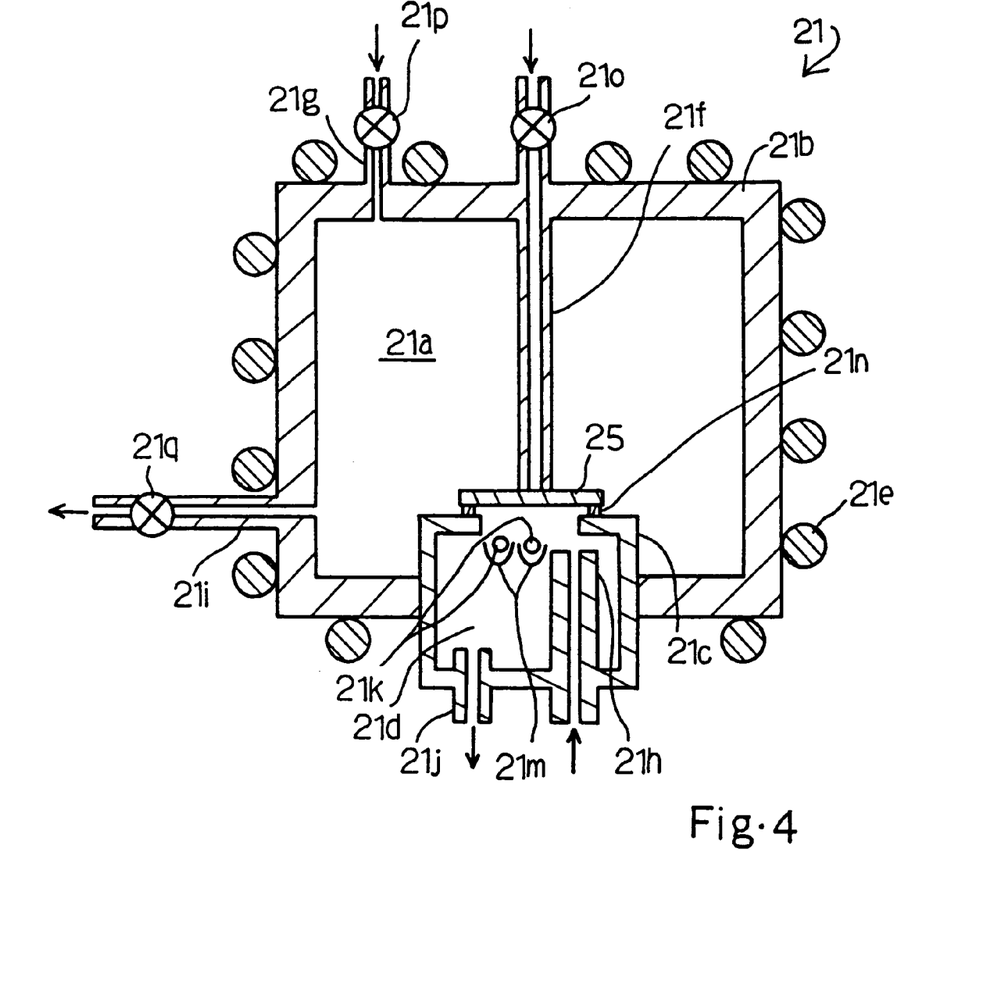
FIG. 4 is a cross sectional view showing a film forming apparatus incorporated in the system.

FIG. 3 illustrates a system for forming a thin film embodying the present invention, and FIG. 4 illustrates the structure of a film forming apparatus 21. The system comprises the film forming apparatus 21, a temperature controller 22, a pressure controller 23 and a liquid material feeder 24. The liquid material feeder 24 supplies liquid material to a semiconductor wafer 25 (see FIG. 4) placed in a chamber 21a (see FIG. 4) of the film forming apparatus 21, and the temperature controller 22 and the pressure controller 23 controls the temperature condition and the pressure condition of a process for forming a thin film according to the present invention.

The temperature controller 22 includes a heater 22a for controlling temperature in the chamber 21a, a heater 22b for the semiconductor wafer 25 and a cooler 22c for the semiconductor wafer 25. Thus, the temperature controller 22 independently regulates the chamber 21a and the semiconductor wafer 25 to appropriate temperature.

The pressure controller 23 includes a pressurizer 23a connected to the chamber 21a and an exhauster 23b also connected to the chamber 21a. The pressurizer 23a increases the pressure of gas or gaseous mixture in the chamber 21a, and the exhauster 23b evacuates the gas/gaseous mixture from the chamber 21a. Thus, the pressurizer 23a cooperates with the exhauster 23b so as to regulate the pressure exerted on the semiconductor wafer 25 in the chamber 21a.

Turning to FIG. 4 of the drawings, the film forming apparatus 21 includes an airtight vessel 21b defining the chamber 21a and a partition wall 21c provided in the chamber 21a, and the partition wall 21c forms a small chamber 21d nested in the chamber 21a. The small chamber 21d is open to the chamber 21a, and the opening is closed by the semiconductor wafer 25.

The film forming apparatus 21 further includes a coil heater 21e provided on the outer surface of the airtight vessel 21b and a pipe 21f connected between the liquid material feeder 24 and the semiconductor wafer 25. The coil heater 21e heats the chamber 21a through the airtight vessel 21b, and serves as the heater 22 for the chamber. The pipe 21f supplies liquid material to the surface of the semiconductor wafer 25. The liquid material may contain at least one molecule expressed by one of molecular formulae 1, 2 and 3. The liquid material may contain more than one molecule expressed by the formulae.

(1)

(2)

(3)

Where Al is aluminum, R1, R2, R3 are independently selected from alkyl group and olefinic hydrocarbon and H is hydrogen. Examples of the liquid material are $Al(CH_3)_3$, $Al(C_2H_5)_3$, $Al(CH_3)_2H$, $Al(i-C_4H_9)_3$, $Al(n-C_3H_7)_3$, $Al(n-C_4H_9)_3$, $Al(C_2H_5)_2H$, $Al(i-C_4H_9)_2H$.

Moreover, amine adduct of aluminum hydroxide ($AlH_3$) may be used as the liquid material, and examples of the amine adduct are $N(CH_3)_2(C_2H_5)$ $AlH_3N(CH_3)_2(C_2H_5)$.

Diluent used for the liquid material may be high-boiling fraction of petroleum hydrocarbon such as, for example, alkylbenzene, alkylnaphthalene, diphenyl ether, paraffin hydrocarbon, naphthene hydrocarbon and aromatic hydrocarbon. The diluent decreases the viscosity of the liquid material, and allows the manufacturer to decreases the gas pressure in the chamber 21a. The liquid material may be supplied through the pipe 21f for forming a copper thin film, a gold thin film or a titanium thin film.

The liquid material may be supplied to the semiconductor wafer 25 for forming an insulating layer. If $Si(OH)_4$ or $Si(OC_2H_5)_4$ is dissolved by using organic solvent such as methanol or acetone, the liquid material is available for silicon oxide. The liquid material is spread over the semiconductor wafer 25, and, thereafter, is heated to 400 degrees in centigrade. Then, a silicon oxide layer is formed on the semiconductor wafer 25.

The film forming apparatus 21 further includes gas inlet ports 21g/21h open to the chamber 21a and the small chamber 21d, respectively, gas outlet ports 21i/21j open to the chamber 21a and the small chamber 21d, respectively, a flash lamp 21k provided in the small chamber 21d and a reflector 21m for directing heat toward the semiconductor wafer 25. The gas inlet ports 21g/21h are connected to the pressurizer 23a, and the gas outlet ports 21i/21j are connected to the exhauster 23b. The gas inlet port 21g supplies high-pressure gas or gaseous mixture from a source of high-pressure gas (not shown) to the chamber 21a, and the other gas inlet port 21h supplies cooling gas or cooling gaseous mixture to the small chamber 21d.

The high-pressure gas/gaseous mixture serves as the pressurizer 23a. The high-pressure gas may be selected from the group consisting of inert gas, hydrogen and nitrogen, and the high-pressure gaseous mixture may contain at least two elements selected from the inert gas, hydrogen and nitrogen. When an aluminum layer is to be formed, the high-pressure gas/gaseous mixture may contain Cu, Sc, Ti, Co or W so as to react with aluminum. The aluminum alloy improves the durability of the wiring. Cu, Ti and W may be supplied to the high-pressure gas/gaseous mixture in the form of compound such as, for example, $(C_5H_5)$ CuP $(C_2H_5)_3$, $TiCl_4$, $WF_6$, Cu $(HFA)_2$, $Cu(AcAc)_2$, $(HFA)$ Cu $(VTMS)$, $Ti[N(CH_3)_2]]_4$, $Ti[N(C_2H_5)_2]_4$, $TiCl_4$ so as to obtain aluminum alloy.

On the other hand, the cooling gas/gaseous mixture serves as the cooler for a semiconductor wafer, and the flash lamp 21k and the reflector 21m as a whole constitute the heater for a semiconductor substrate 22b. The cooling gas may be nitrogen. In order to seal the cooling gas/gaseous mixture in the small chamber 21d, a seal ring 21n such as an o-ring is provided between the partition wall 21c and the periphery of the semiconductor wafer 25. Valves 21o, 21p and 21q are connected to the pipe 21f, the gas inlet port 21p and the gas outlet port 21l, respectively.

Figure 5A:
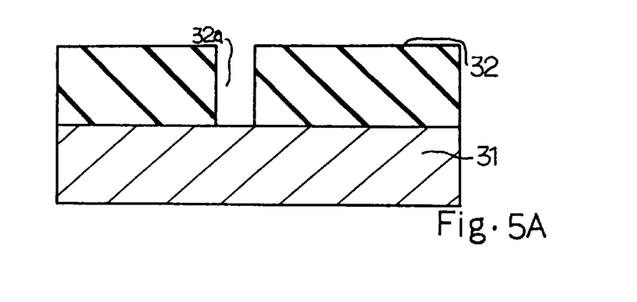
FIGS. 5A to 5D are cross sectional views showing a process sequence for forming a thin film according to the present invention.

FIGS. 5A to 5D illustrate a process sequence embodying the present invention. The process starts with preparation of a silicon wafer 31, and silicon oxide is deposited over the silicon wafer 31 so as to cover the silicon wafer 31 with a silicon oxide layer 32. Photo-resist solution is spun onto the silicon oxide layer 32, and is baked so as to form a photo-resist layer. A pattern image for contact holes is optically transferred from a reticle (not shown) to the photo-resist layer, and a latent image is formed in the photo-resist layer. The latent image is developed, and a photo-resist etching mask is formed on the silicon oxide layer 32. Predetermined areas are exposed to hollow spaces of the photo-resist etching mask. Using the photo-resist etching mask, the silicon oxide layer 32 is selectively etched away, and contact holes are formed in the silicon oxide layer 32. FIG. 5A shows one of the contact holes 32a, and description is hereinbelow focused on the contact hole 32a. A contact area of the silicon wafer 31 is exposed to the contact hole 32a. Although the silicon oxide layer 32 is laminated on the silicon wafer 31, the laminated structure is simply referred to as "semiconductor wafer 25".

Subsequently, the semiconductor wafer 25 is inserted into the chamber 21a, and is placed on the seal ring 21n. The valves 21o and 21p are closed, and the valve 21q is opened. The exhauster 23b is actuated, and vacuum is developed in the chamber 21a. When the vacuum reaches a predetermined value, the valve 21q is closed. The coil heater 21e is energized so as to heat the chamber 21a, and the chamber 21a is maintained to be higher in temperature than the semiconductor wafer 25 by +20 degrees to +50 degrees in centigrade but not higher than the decomposition temperature of the liquid material. The cooling gas passes through the small chamber 21d, and the semiconductor wafer 25 is cooled at −70 degrees in centigrade to room temperature.

It is possible to take one of the following temperature control procedures:

1) Only the semiconductor wafer 25 is cooled;
2) Only the chamber 21a is heated;
3) The semiconductor wafer 25 is cooled, and the chamber 21a is heated;
4) Both of the semiconductor wafer 25 and the chamber 21a are heated to different temperatures;
5) Both of the semiconductor wafer 25 and the chamber 21a are cooled to different temperatures.

However, the third procedure is the most appropriate, because a wide temperature difference is produced between the semiconductor wafer 25 and the chamber 21a.

Figure 5B:
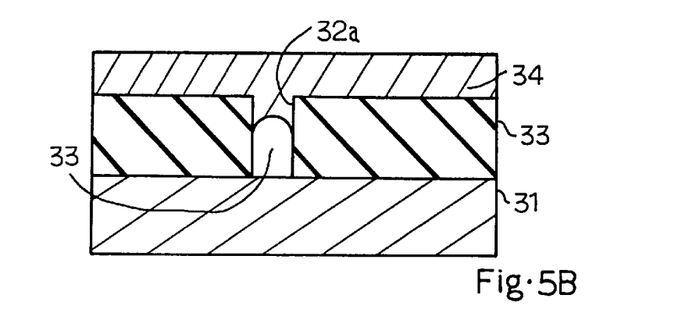

Subsequently, the valve 21o is opened, and the liquid material is supplied onto the silicon oxide layer 32. It is recommendable to spread the liquid material by using a spin coating technology. If the partition wall 21c is connected to a suitable driving mechanism (not shown), the partition wall 21c is driven for rotation together with the semiconductor wafer 25. In this instance, the liquid material mainly contains diisobutyl-aluminum-hydride expressed as $Al(i-C_4H_9)_2H$. Although the liquid material enters into an upper space of the contact hole 32a, the liquid material does not reach the silicon wafer 31 due to the large viscosity of diisobutyl-aluminum-hydride, and a void 33 takes place between the silicon wafer 31 and the liquid material layer. The cooled semiconductor wafer 25 condenses the diisobutyl-aluminum-hydride on the silicon oxide layer 32, and the void 33 is confined between the silicon wafer 31 and the layer 34 of the condensate of diisobutyl-aluminum-hydride as shown in FIG. 5B.

Figure 5C:
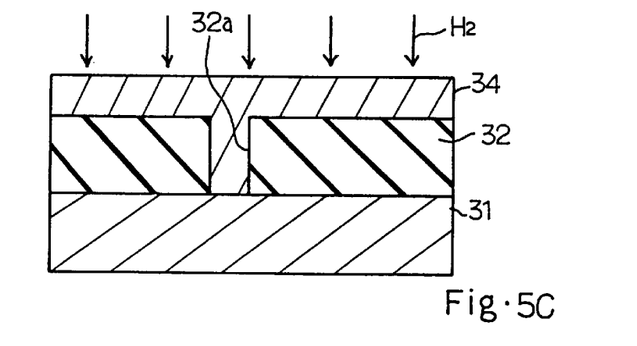

Subsequently, the valve 21p is opened, and the high-pressure gas is introduced into the chamber 21a. In this instance, the high-pressure gas is hydrogen, and the pressure is regulated to 100 kg/square-cm. The high-pressure gas presses down the layer 34 of the condensate, and the layer 34 of the condensate reaches the silicon wafer 31 as shown in FIG. 5C. Thus, the void 33 is collapsed by exerting the force on the layer 34 of the condensate.

Figure 5D:
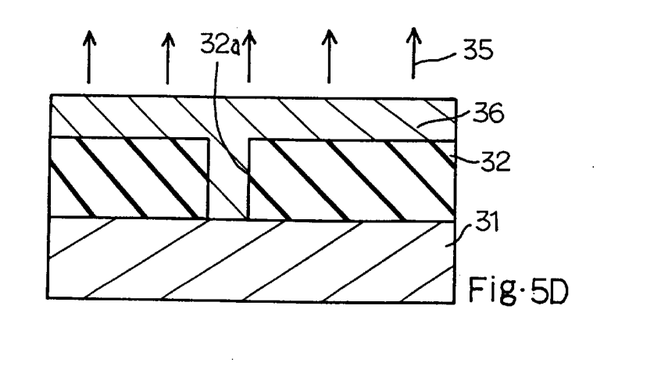

The valves 21p and the 21o are closed, and the flash lamp 21k radiates light, and the reflector 21m directs the light toward the semiconductor wafer 25. The layer 34 of the condensate is rapidly heated to 400 degrees in centigrade, and the condensate is decomposed as follows.

$$2(CH_3)_3Al + 3H_2 \rightarrow 2Al + 6CH_4 \qquad (4)$$

$$4(CH_3)_2Al \rightarrow 2Al + 2(CH_3)_3Al + 2CH_4 + H_2 \qquad (5)$$

$$2Al(i-C_4H_9)_3 + 3H_2 \rightarrow 2Al + 6(i-C_4H_{10})) \qquad (6)$$

As a result, gaseous product 35 is separated from an aluminum layer 36, and the aluminum layer 36 not only perfectly fills the contact hole 32a but also extends over the silicon oxide layer 32.

The present inventor evaluated the aluminum layer 36, and confirmed that the aluminum layer 36 was lower in resistivity than those formed through the prior art processes.

As will be appreciated from the foregoing description, the condensate is pushed into the contact hole 32a, and the contact hole 32a is perfectly filled with the condensate. The semiconductor wafer 25 cooled rather than the chamber 21a allows the liquid material to smoothly enter into the contact hole. Low temperature makes the vapor pressure of the liquid material small, and the condensate easily flow into the contact hole against the vaporized material. For this reason, no void takes place in the contact hole, and the contact hole 32a is perfectly plugged with a piece of metal.

Second Embodiment

Figure 6:
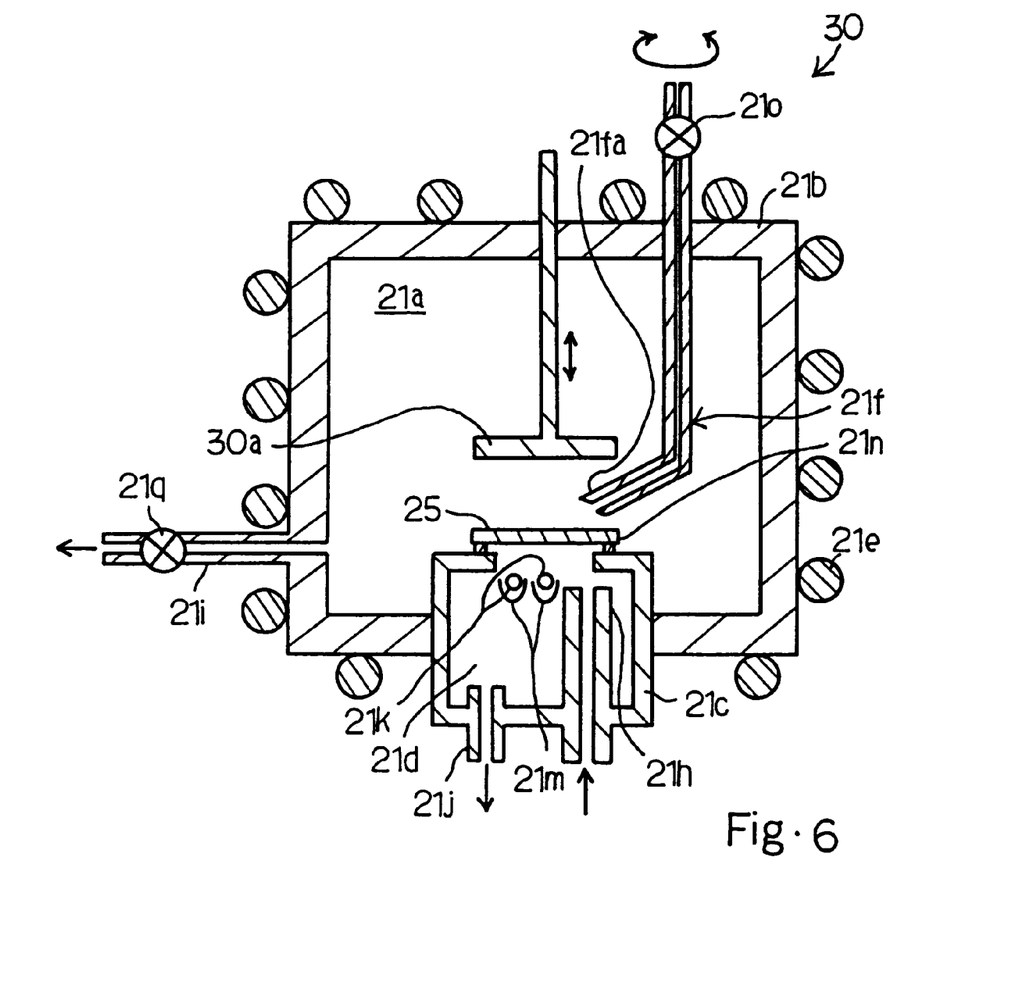
FIG. 6 is a cross sectional view showing the structure of another film forming apparatus according to the present invention.

FIG. 6 illustrates another film forming apparatus 30 embodying the present invention. A piston 30a projects into the chamber 21a, and the gas inlet port 21g and the valve 21p are removed from the film forming apparatus. However, the other components are similar to those of the first embodiment. For this reason, other component members corresponding to those of the first embodiment are labeled with same references without detailed description.

The piston 30a is aligned with the semiconductor wafer, and is reciprocally moved onto and from the semiconductor wafer 25 by means of a suitable linear motion mechanism (not shown). The pipe 21f is offset from the center of the semiconductor wafer 25, and is turnable around a center axis thereof. For this reason, the outlet end 21fa of the pile is moved between a feeding position over the semiconductor wafer 25 and a resting position out of the trajectory of the piston 30a.

Figure 7A:
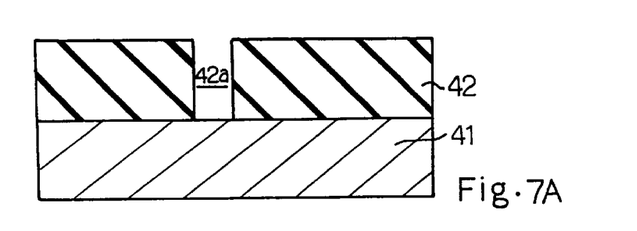
FIGS. 7A to 7D are cross sectional views showing another process sequence for forming a thin film according to the present invention.

FIGS. 7A to 7D illustrate another process sequence embodying the present invention. The process starts with preparation of a silicon wafer 41, and silicon oxide is deposited over the silicon wafer 41 so as to cover the silicon wafer 41 with a silicon oxide layer 42. Photo-resist solution is spun onto the silicon oxide layer 42, and is baked so as to form a photo-resist layer. A pattern image for contact holes is optically transferred from a reticle (not shown) to the photo-resist layer, and a latent image is formed in the photo-resist layer. The latent image is developed, and a photo-resist etching mask is formed on the silicon oxide layer 42. Predetermined areas are exposed to hollow spaces of the photo-resist etching mask. Using the photo-resist etching mask, the silicon oxide layer 42 is selectively etched away, and contact holes are formed in the silicon oxide layer 42. FIG. 7A shows one of the contact holes 42a, and description is hereinbelow focused on the contact hole 42a. A contact area of the silicon wafer 41 is exposed to the contact hole 42a. Although the silicon oxide layer 42 is laminated on the silicon wafer 41, the laminated structure is simply referred to as "semiconductor wafer 25".

Subsequently, the semiconductor wafer 25 is inserted into the chamber 21a, and is placed on the seal ring 21n. The piston 30a is spaced from the semiconductor wafer 25, and the valve 21o is closed. The valve 21q is opened, and the exhauster 23b is actuated. Then, vacuum is developed in the chamber 21a. When the vacuum reaches a predetermined value, the valve 21q is closed. The coil heater 21e is energized so as to heat the chamber 21a, and the chamber 21a is maintained within the temperature range similar to the first embodiment. The cooling gas passes through the small chamber 21d, and the semiconductor wafer 25 is cooled in the same range as the first embodiment.

Figure 7B:
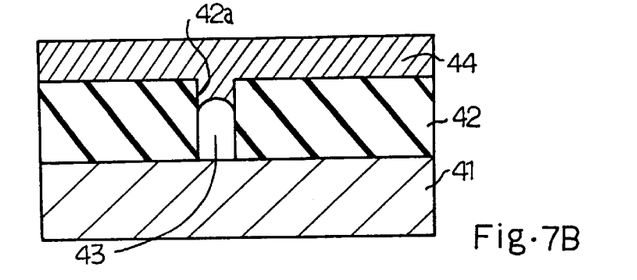

Subsequently, the valve 21o is opened, and the liquid material is supplied onto the silicon oxide layer 42. It is also recommendable to spread the liquid material by using a spin coating technology. In this instance, the liquid material contains diisobutyl-aluminum-hydride expressed as Al(i-C$_4$H$_9$)$_2$H as similar to the first embodiment. Although the liquid material enters into an upper space of the contact hole 42a, the liquid material does not reach the silicon wafer 41 due to the large viscosity of diisobutyl-aluminum-hydride, and a void 43 takes place between the silicon wafer 41 and the liquid material layer. The cooled semiconductor wafer 25 condenses the diisobutylaluminum-hydride on the silicon oxide layer 42, and the void 43 is confined between the silicon wafer 41 and the layer 44 of the condensate of diisobutylaluminum-hydride as shown in FIG. 7B. The valve 21o is closed.

Figure 7C:
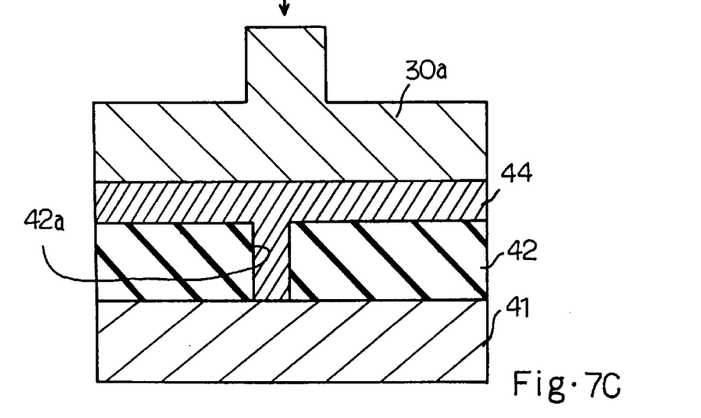

Subsequently, the piston is downwardly moved onto the layer 44 of condensate, and presses the layer 44 at 100 kg/square-cm. Then, the condensate is pushed down, and reaches the silicon wafer 41. Thus, the void 43 is collapsed.

Figure 7D:
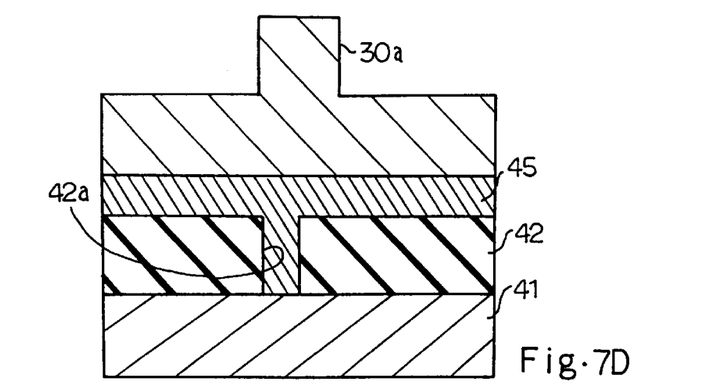

The flash lamp 21k starts to radiate light, and the reflector 21m directs the light toward the semiconductor wafer 25. The layer 44 of the condensate is rapidly heated to 400 degrees in centigrade, and the condensate is decomposed. As a result, gaseous product is separated from an aluminum layer 45, and the aluminum layer 45 not only perfectly fills the contact hole 42a but also extends over the silicon oxide layer 42.

The second embodiment mechanically exerts force on the layer of condensate, and removes the void from the contact hole 42a.

As will be understood from the foregoing description, the temperature controller 22 and the pressure controller 23 cause the liquid material to fill the contact hole 32a/42a without a void, and allow the manufacturer to employ miniature contact holes with a high aspect ratio in a semiconductor device. This results in improvement of integration density.

Moreover, if the liquid material provides a high-purity metallic thin film through the pyrolysis thereof, the metallic thin film accelerates the signal propagation, and is available for a high-speed semiconductor integrated circuit device.

Although particular embodiments of the present invention have been shown and described, it will be obvious to those skilled in the art that various changes and modifications may be made without departing from the spirit and scope of the present invention.

For example, the semiconductor wafer 31 may be cooled by using liquid nitrogen.

The condensate may be heated by using an electric heater, a laser radiating system or an infrared light radiator.

What is claimed is:

1. A process of forming a solid thin film, comprising the steps of:
    a) preparing a substrate structure having at least one recess open to a surface of said substrate structure;
    b) changing the temperature of said substrate structure to lower than an ambient temperature;
    c) creating vacuum around said substrate structure;
    d) supplying liquid material onto said surface structure so as to form a layer of liquid material on said surface;
    e) pressing through exposure to high-pressure gas said layer of liquid material so as to perfectly fill said recess with said liquid material, wherein said high-pressure gas is selected from the group consisting of inert gas, hydrogen, nitrogen and a mixtures containing at least two gases selected from said group, and wherein and said high-pressure gas contains at least one element selected from Cu, Sc, Ti, Co, and W; and
    f) heating said liquid material so as to form a solid layer from said liquid layer.

2. The process as set forth in claim 1, in which said at least one element is mixed into said high-pressure gas in the form of compound selected from the group consisting of (C$_5$H$_5$) CuP (C$_2$H$_5$)$_3$, TiCl$_4$, WF$_6$.

3. The process as set forth in claim 1, in which said liquid material is spread over said surface by using a spin coating in said step d).

4. A process as set forth in claim 1, in which said liquid material contains at least one molecule expressed by chemical formulae 1) 2) or 3)

$$R1_n AlH_{3-n} \quad (n \leq 3, \text{ n is a positive integer}) \quad (1)$$

$$R1_n r2_m AlH_{3n-m} \quad (n,m \leq 2, \text{ n+m} \leq 3, \text{ n and m are positive integer}) \quad (2)$$

$$R1R2R3Al \quad (3)$$

where Al is aluminum, R1, R2, R3 are independently selected from alkyl group and olefinic hydrocarbon and H is hydrogen.

5. The process as set forth in claim 4, in which said at least one molecule is selected from the group consisting of Al(CH$_3$)$_3$, Al(C$_2$H$_5$)$_3$, Al(CH$_3$)$_2$H, Al(i-C$_4$H$_9$)$_3$, Al(n-C$_3$H$_7$)$_3$, Al(n-C$_4$H$_9$)$_3$, Al(C$_2$H$_5$)$_2$H, Al(i-C$_4$H$_9$)$_2$H.

6. The process as set forth in claim 1, in which said liquid material contains amine adduct of aluminum hydroxide.

7. The process as set forth in claim 6, in which said amine adduct is expressed as N(CH$_3$)$_2$(C$_2$H$_5$) AlH$_3$N(CH$_3$)$_2$ (C$_2$H$_5$).

8. The process as set forth in claim 4, in which said liquid material further contains diluent or high-boiling fraction of petroleum hydrocarbon.

9. The process as set forth in claim 8, in which said diluent is selected from the group consisting of alkylbenzene, alkylnaphthalene, diphenyl ether, paraffin hydrocarbon, naphthene hydrocarbon and aromatic hydrocarbon.

10. The process as set forth in claim 6, in which said liquid material further contains diluent of high-boiling fraction of petroleum hydrocarbon.

11. The process as set forth in claim 10, in which said diluent is selected from the group consisting of alkylbenzene, alkylnaphthalene, diphenyl ether, paraffin hydrocarbon, naphthene hydrocarbon and aromatic hydrocarbon.

* * * * *